United States Patent [19]

Hovel et al.

[11] Patent Number: 4,482,906
[45] Date of Patent: Nov. 13, 1984

[54] GALLIUM ALUMINUM ARSENIDE INTEGRATED CIRCUIT STRUCTURE USING GERMANIUM

[75] Inventors: Harold J. Hovel, Katonah; Robert Rosenberg, Peekskill, both of N.Y.

[73] Assignee: International Business Machines Corporation, Armonk, N.Y.

[21] Appl. No.: 393,951

[22] Filed: Jun. 30, 1982

[51] Int. Cl.[3] .................................... H01L 29/161
[52] U.S. Cl. .................................... 357/16; 357/17; 357/30
[58] Field of Search ............ 357/16, 30, 30 E, 30 G, 357/17

[56] References Cited

U.S. PATENT DOCUMENTS

| | | | |
|---|---|---|---|
| 3,954,534 | 5/1976 | Scifres et al. | 357/17 X |
| 3,963,536 | 6/1976 | Ettenberg et al. | 357/16 X |
| 4,035,829 | 7/1977 | Ipri et al. | 357/49 |
| 4,047,123 | 9/1977 | Kirkby | 357/16 X |
| 4,075,651 | 2/1978 | James | 357/16 X |
| 4,212,020 | 7/1980 | Yariv et al. | |
| 4,346,394 | 8/1982 | Figueroa et al. | 357/16 X |
| 4,370,510 | 1/1983 | Stirn | 357/30 X |
| 4,385,198 | 5/1983 | Rahilly | 357/30 X |

OTHER PUBLICATIONS

Thorsen et al., "Heteroepitaxial GaAs on Aluminum Oxide: Electrical Properties of Undoped Films," *Journal of Applied Physics*, vol. 42, No. 6, pp. 2519-2527.

J. Vac. Sci. Technol., 16(2), Mar./Apr. 1979, pp. 290-294, "MBE-Grown Insulating Oxide Films on GaAs" by K. Ploog et al.

Metallurgical Transactions, vol. 1, Mar. 1970, pp. 623-628, "Heteroepitaxial GaAs on Aluminum Oxide, Early Growth Studies," by Manasevit et al.

Electronics Letters, vol. 14, No. 1, Jan. 5, 1978, pp. 19 and 20, "GaAs MAOSFET Memory Transistor" by Bayraktaroglu et al.

Japanese Journal of Applied Physics, vol. 19, No. 5, May 1980, pp. L225-L227, "A New Field-Effect Transistor with Selectively Doped GaAs/n-$Al_xGa_{1-x}As$ Heterojunctions", by Takashi Mimura et al.

Primary Examiner—Martin H. Edlow
Assistant Examiner—William A. Mintel
Attorney, Agent, or Firm—Alvin J. Riddles

[57] ABSTRACT

An integrated circuit structure made up of a monocrystalline substrate on which there is an epitaxial intermediate layer of GaAlAs or GaAlAs and Ge with the Ge adjacent to the substrate. The structure is equipped with a single or a combined device epitaxial layer involving GaAs and GaAlAs. The intermediate GaAlAs layer permits substrate, circuit and optical signal application flexibility.

3 Claims, 5 Drawing Figures

GALLIUM ALUMINUM ARSENIDE INTEGRATED CIRCUIT STRUCTURE USING GERMANIUM

DESCRIPTION

1. Technical Field

The technical field of the invention is in integrated circuits. Intermetallic semiconductor material crystals of more than one element such as GaAs and GaAlAs have a number of properties useful in integrated circuit structures but to take full advantage of those properties it is necessary to build the integrated circuit structure in a thin layer with properties that produce device advantages supported by a substrate with different properties. It is desirable that the properties of the substrate have minimal effect on the properties of the device layer.

2. Background Art

One integrated circuit structure in use in the art involves making the integrated circuit in a layer of GaAs on a substrate of high resistivity or semi-insulating GaAs. In this structure impurities in the doping that render the substrate semi-insulating have a detrimental effect on device performance.

Another integrated circuit structure developed in the art involves the making and the isolating of integrated circuits in a layer of GaAs on a substrate of Al$_2$O$_3$ as described in Metallurgical Transactions Vol. 1, March 1970, pages 623–628 and in Journal of Applied Physics Vol. 42, No. 6, May 1971, pages 2519–2527. In this type of structure, problems are encountered with crystal defects at the GaAs-Al$_2$O$_3$ interface.

Still another semiconductor structure involves selectively doped very thin layers of different semiconductor materials. This structure is known as a high electron mobility transistor (HEMT) and is described in the Japanese Journal of Applied Physics, Vol. 19, No. 5, May 1980, pp. L225 to L227. This structure places very stringent requirements on the quality of the substrate and the semiconductor material adjacent the device.

DISCLOSURE OF THE INVENTION

In accordance with the invention there is provided an epitaxial structure with an at least one stage intermediate layer of GaAlAs or of GaAlAs and Ge between a lattice spacing compatible insulating substrate and a lattice spacing compatible semiconductor layer in which the devices of the integrated circuit are to be positioned. The GaAlAs may be undoped or may contain impurities for device performance affecting purposes. The Ge, where used, provides lattice accommodation and improved epitaxial growth in processing. The substrate under these conditions may be chosen to impart a variety of properties such as resistance, optical transparency and thermal conductance.

The invention may be viewed as an intermediate manufacturing product which may be employed in a variety of ways to achieve integrated circuit structure benefits.

Figure 1:
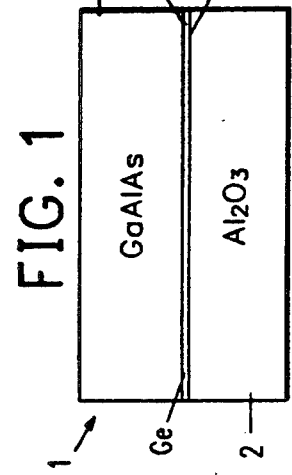
FIG. 1 is an illustration of the substrate of the invention.

Referring to FIG. 1, the invention 1 has a crystalline substrate 2 which is epitaxially joined at a line of demarcation 3 with an epitaxial layer of GaAlAs 4. The GaAlAs 4 is generally undoped but may contain conductivity type impurities in accordance with the properties desired to be imparted to the ultimate integrated circuit structure. Since GaAlAs may have varying quantities of Ga and Al usually described as Ga$_x$Al$_{1-x}$As where x varies from about 0.1 to 0.9 and the electrical, and the optical properties vary with x, in accordance with the invention much flexibility is achieved. The GaAlAs intermediate layer 4 is epitaxial with the crystalline substrate 2 and provides a barrier to electrons, which will be in a device layer formed over the exposed surface of at least portions of the layer 4, from interacting with interface defects at the interface 3. The GaAlAs intermediate layer 4 also permits wide differences in resistance properties in the material chosen for the substrate 2 from affecting the properties of the integrated circuit devices. The GaAlAs intermediate layer 4 may also include a thin layer 5 of Ge which operates to improve the lattice spacing transition from the spacing of the substrate 2 and the GaAlAs of the layer 4.

The substrate 2 is of a crystalline material with crystal structure and lattice spacing compatible with epitaxial growth of the GaAlAs layer 4. The substrate may be of insulating material such as sapphire, spinel, ZnSe or conducting GaAs. Where the substrate 2 is optically transparent and light transmittance is employed as part of the application of the invention, the Ge layer 5 would not be used since it is optically opaque to the frequencies of most device materials such as GaAs and GaAlAs.

In accordance with the invention, the combined intermediate GaAlAs 4 or GaAlAs and Ge layer 4 and 5 and substrate 2 intermediate product may be employed in the types of integrated circuit structures of FIGS. 2, 3, 4 and 5 which illustrate various properties.

Figure 2:
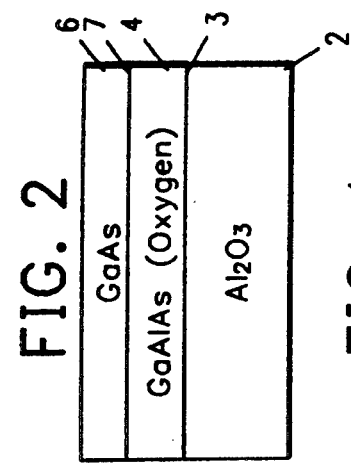
FIGS. 2, 3, 4 and 5 are structural variations of applications of the invention.
Figure 4:
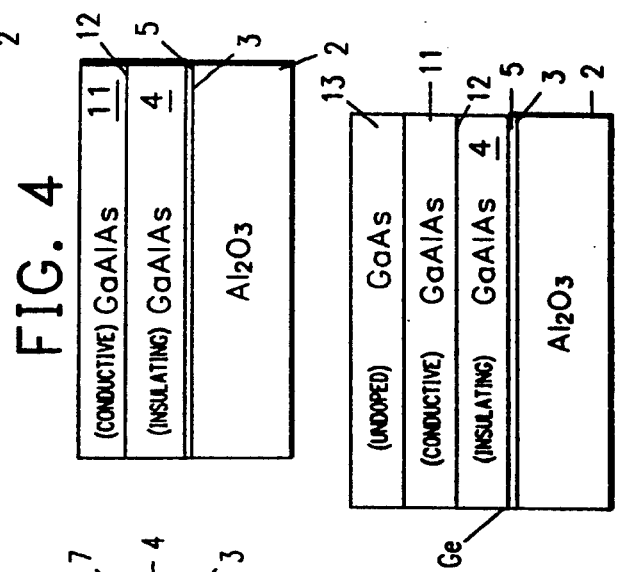
Figure 5:
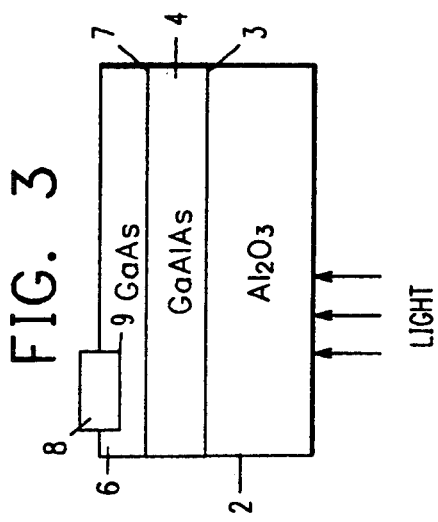
Figure 3:
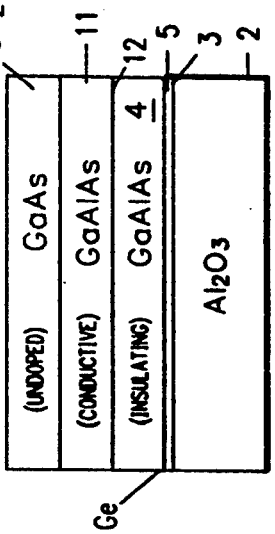

The structure of FIG. 2 is illustrative of the resistivity flexibility of the invention. The structure of FIG. 3 is illustrative of the optical property flexibility of the invention. FIGS. 4 and 5 are illustrative of the semiconductor properties of the invention.

Referring next to FIG. 2, the intermediate structure of FIG. 1 is provided with an epitaxial device layer 6 of GaAs in which the integrated circuit is to be formed. The layer 6 joins the GaAlAs layer 4 epitaxially at an interface 7. In FIG. 2, the region 4 and the region 6 may be provided with oxygen in the parts per million range. This causes the GaAlAs layer 4 to be highly insulating. The oxygen will also cause the GaAs layer 6 to have the property of high resistivity so that processing operations such as ion implantation to produce arrays of field effect transistors may be employed.

In FIG. 2, while the Ge lattice accommodation layer 5 is not shown, the addition of a 5 micron thickness layer 5 of Ge would permit a wider lattice spacing tolerance in the selection of the material for the substrate 2. Where the substrate 2 is made of the material Al$_2$O$_3$ the defects at the interface 3 may not, however, be a sufficient problem to justify adding the Ge layer 5 with the added processing complexity.

Referring next to FIG. 3, an optically active device 8 such as a region of GaAs with a p-n junction 9 or a Schottky barrier is positioned on at least a portion of the surface of the region 6. When the structure of FIG. 3 is used, a device actuating signal of light 10 can be introduced through a transparent substrate 2 of Al$_2$O$_3$ and the intermediate region 4 to produce carriers in the device layer 6 to be collected through an external ohmic contact, not shown, to the device 8.

Optical performance can be improved by providing a low recombination velocity condition well known in the photovoltaic cell art at the interface 7.

It will be apparent that the Ge layer 5 would not be used in this structure since the Ge would operate to attenuate the wavelength of light employed with GaAs.

In this structure the invention provides an integrated circuit responsive to optical signals applied through the substrate.

Referring next to FIG. 4, the GaAlAs region 4 is made insulating and is equipped with a conductive GaAlAs layer 11 epitaxially joined to the region 4 at an interface 12. The layer 11 may be formed by the techniques of ion implantation, diffusion or vapor growth.

Referring next to FIG. 5, a layer 13 of undoped GaAs is added to the structure of FIG. 4 where the GaAs layer 13 and the conductive GaAlAs layer 11 are at least 0.06 micrometers thick to provide an improved structure for the high electron mobility transistor (HEMT) device currently receiving attention in the art. In this type of device the layers are so thin that advantage can be taken of the spatial separation between electrons and their parent donor impurities.

In accordance with the invention, additional advantages occur with the practice of the invention. Misfit dislocations at the interface 3 will be passive in structures employing the invention as opposed to the conditions present in the "silicon on sapphire" type structures common in the silicon industry. Further, imperfections originating at the interface 3 will propagate in the intermediate layer 4 but will not grow perpendicular to the interfaces 7 and 12 between the intermediate and device layers and when they reach the device layers 6 and 11 they will propagate parallel to the interfaces 7 and 12 resulting in a higher device quality layer.

BEST MODE FOR CARRYING OUT THE INVENTION

In accordance with the invention, a preferred embodiment of the invention would involve a structure similar to FIG. 2 with a substrate 2 of $Al_2O_3$ of sufficient thickness for handling. A 2 to 20 micron thick layer 4 of $Ga_{0.5x}Al_{1-.5x}As$ is epitaxially grown thereon, through the technique of the decomposition of vapors of trimethyl aluminum, trimethyl gallium and arsine. This is followed by a layer of GaAs of at least 0.1 micron thickness in which no Al-containing vapor is provided in the growth with the Ga source and the As source. The GaAs layer 6 in order to be useful for active devices should have an average carrier mobility of the order of 5,000 centimeters$^2$ per volt second and have a doping concentration between $10^{15}$ and $10^{16}$ atoms per cc. Where the Ge layer 5 is employed, it would be grown first on the $Al_2O_3$ to a depth of around 5 microns followed by the GaAlAs described.

Alternately, the GaAs layer 6 could be 2 to 20 microns thick and oxygen doped to render it high resistivity and a technique such as ion implantation used to form the active device region.

What has been described is an intermediate manufacturing product for the fabrication of integrated circuits wherein an intermediate layer of GaAlAs or of GaAlAs and Ge is provided between the substrate and the device layer.

Having thus described our invention, what we claim as new and desire to secure by Letters Patent is:

1. An epitaxial layered semiconductor structure comprising in combination
   a substrate taken from the group of sapphire, spinel and ZnSe,
   an intermediate layer of the combination of a GaAlAs layer and a Ge layer with the Ge layer adjacent said substrate, and
   a device portion of at least one layer of GaAs and GaAlAs adjacent the intermediate layer.

2. The structure of claim 1 wherein said substrate is sapphire, said intermediate layer is a layer of Ge adjacent said substrate and a layer of GaAlAs adjacent said device portion.

3. The structure of claim 1 wherein said Ge layer is 5 microns thick and said GaAlAs layer is in the range of 2 to 20 microns.

* * * * *